US011049745B2

(12) United States Patent
Dowling et al.

(10) Patent No.: US 11,049,745 B2
(45) Date of Patent: Jun. 29, 2021

(54) DEFECT-LOCATION DETERMINATION USING CORRECTION LOOP FOR PIXEL ALIGNMENT

(71) Applicant: KLA-Tencor Corporation, Milpitas, CA (US)

(72) Inventors: David Dowling, Chalfont St. Peter (GB); Tarunark Singh, Reading (GB); Bjorn Brauer, Beaverton, OR (US); Santosh Bhattacharyya, San Jose, CA (US); Bryant Mantiply, Mountain View, CA (US); Hucheng Lee, Cupertino, CA (US); Xiaochun Li, San Jose, CA (US); Sangbong Park, Union City, CA (US)

(73) Assignee: KLA Corporation, Milpitas, CA (US)

( * ) Notice: Subject to any disclaimer, the term of this patent is extended or adjusted under 35 U.S.C. 154(b) by 101 days.

(21) Appl. No.: 16/417,645

(22) Filed: May 21, 2019

(65) Prior Publication Data
US 2020/0126830 A1    Apr. 23, 2020

Related U.S. Application Data

(60) Provisional application No. 62/748,043, filed on Oct. 19, 2018.

(51) Int. Cl.
*H01L 21/67* (2006.01)
*G06T 7/00* (2017.01)

(52) U.S. Cl.
CPC ........ *H01L 21/67288* (2013.01); *G06T 7/001* (2013.01); *G06T 2207/30148* (2013.01)

(58) Field of Classification Search
None
See application file for complete search history.

(56) References Cited

U.S. PATENT DOCUMENTS 9,996,942 B2    6/2018   Bhattacharyya et al.
10,474,133 B2   11/2019  Lee et al.
(Continued)

FOREIGN PATENT DOCUMENTS

| EP | 0853856 A1 | 7/1998 |
| KR | 1020170129892 A | 11/2017 |
| KR | 1020180061556 A | 6/2018 |

OTHER PUBLICATIONS

PCT/US2019/056168, "International Search Report," dated Jan. 30, 2020.
(Continued)

*Primary Examiner* — Leon Flores
(74) *Attorney, Agent, or Firm* — Huse IP Law; Charles C. Huse (57) ABSTRACT

A method of semiconductor-wafer image alignment is performed at a semiconductor-wafer defect-inspection system. In the method, a semiconductor wafer is loaded into the semiconductor-wafer defect-inspection system. Pre-inspection alignment is performed for the semiconductor wafer. After performing the pre-inspection alignment, a first swath is executed to generate a first image of a first region on the semiconductor wafer. An offset of a target structure in the first image with respect to a known point is determined. Defect identification is performed for the first image, using the offset. After executing the first swath and determining the offset, a second swath is executed to generate a second image of a second region on the semiconductor wafer. While executing the second swath, run-time alignment of the semiconductor wafer is performed using the offset.

16 Claims, 4 Drawing Sheets

(56) References Cited

U.S. PATENT DOCUMENTS

2007/0230770 A1 10/2007 Kulkarni et al.
2017/0228866 A1 8/2017 Jain et al.
2018/0053292 A1* 2/2018 Song ...................... G06T 7/001

OTHER PUBLICATIONS

PCT/US2019/056168, "Written Opinion of the International Searching Authority," dated Jan. 30, 2020.

* cited by examiner

DEFECT-LOCATION DETERMINATION USING CORRECTION LOOP FOR PIXEL ALIGNMENT

RELATED APPLICATION

This application claims priority to U.S. Provisional Patent Application No. 62/748,043, filed Oct. 19, 2018, titled "Defect Location Accuracy," which is hereby incorporated by reference in its entirety for all purposes.

TECHNICAL FIELD

This disclosure relates to defect inspection for semiconductor wafers, and more specifically to wafer image alignment for defect detection.

BACKGROUND

Defects may be identified on a semiconductor wafer by generating a target image of a target die, using an inspection tool, and subtracting a reference image of a reference die from the target image (or vice-versa). Differences between the target image and reference image may represent defects. For such defect identification to be accurate, respective pixels in the target image should correspond to the same location on the die as respective pixels in the reference image. Wafers therefore should be accurately aligned in the inspection tool to ensure this correspondence of pixels between the target and reference images. Target to reference wafer image alignment in an inspection tool, however, presents significant challenges. For example, localized heating of a semiconductor wafer during inspection can cause localized changes in die size. These localized changes degrade the alignment and thereby degrade the accuracy with which defect locations are identified. In another example, any misalignment between the die rows and columns on a wafer and the x-translation and y-translation stages of the wafer chuck in the inspection tool will degrade the accuracy of defect-location identification. Other factors such as vibrations may also affect wafer image alignment and thus the accuracy of defect-location identification.

Figure 1:
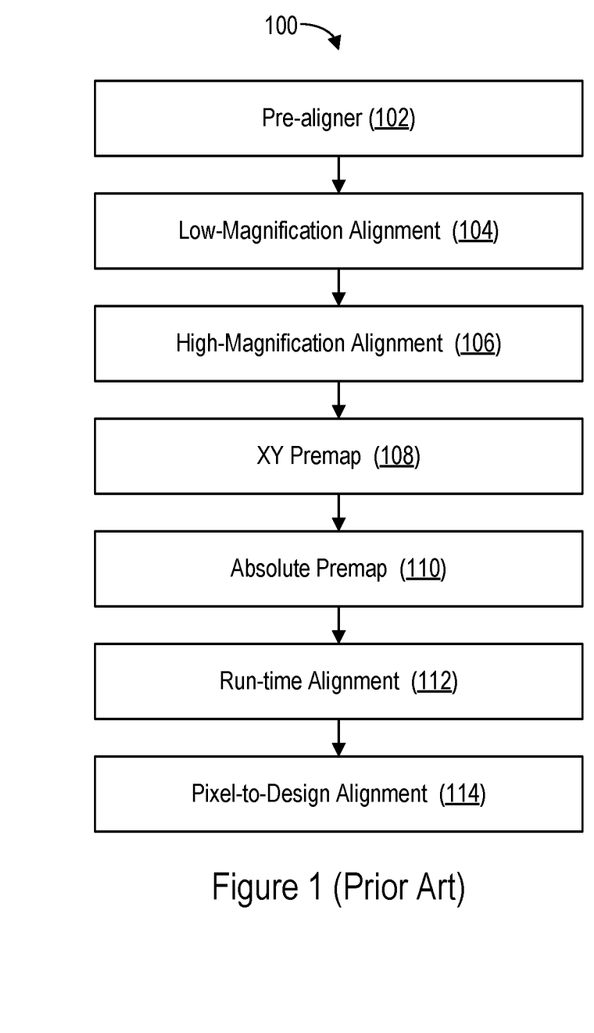
FIG. 1 is a flowchart showing a prior-art method of aligning a semiconductor wafer in a semiconductor-wafer defect-inspection system.
Figure 3:
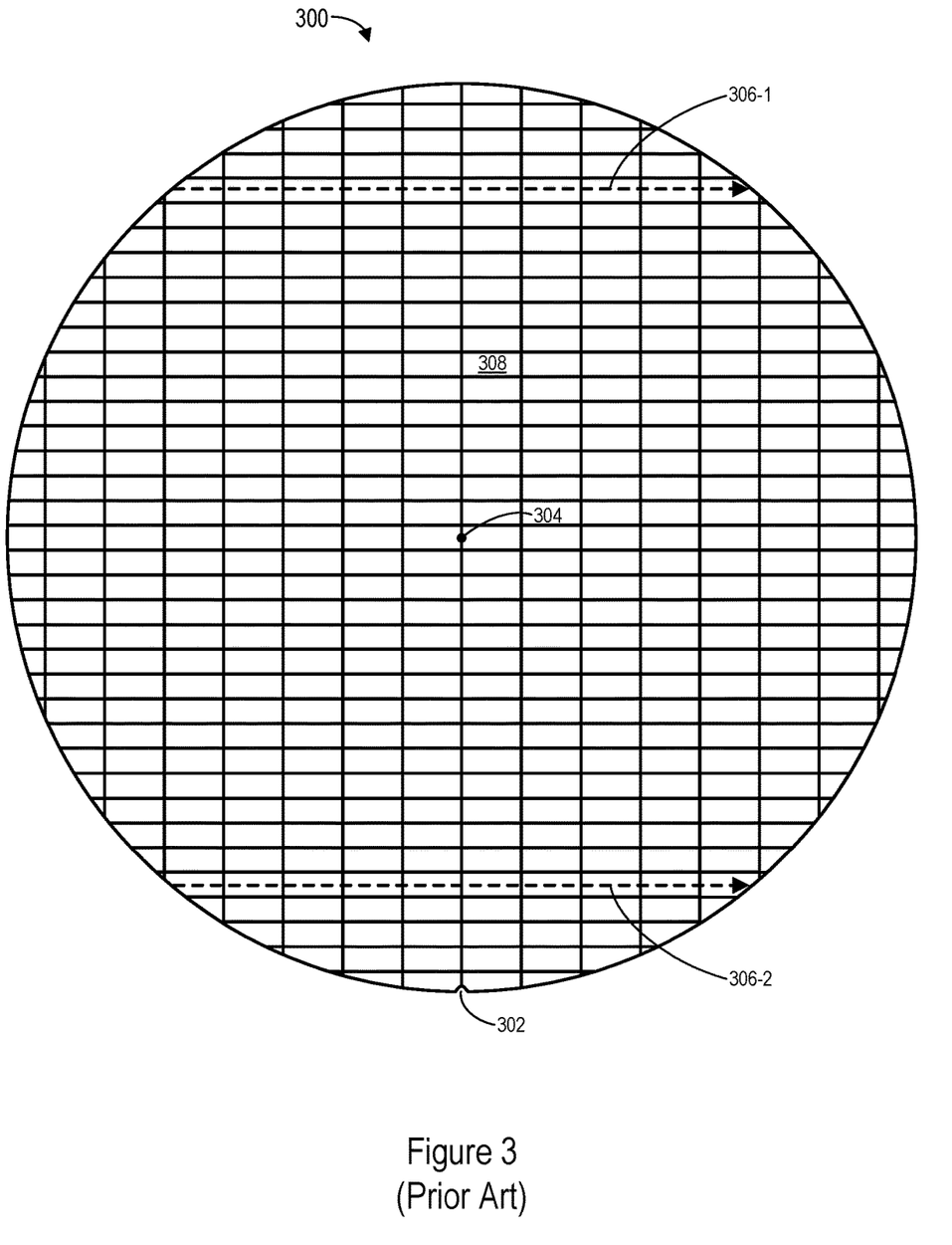
FIG. 3 is a plan view of a semiconductor wafer with a plurality of die.

FIG. 1 is a flowchart showing a prior-art wafer-alignment method 100 performed in a semiconductor-wafer defect-inspection system. The method 100 is described with respect to a semiconductor wafer 300 with a plurality of die 308 (FIG. 3). In the method 100, a pre-aligner step 102 is first performed before the wafer 300 has been loaded onto a wafer chuck of the inspection system. The pre-aligner step 102 involves locating the wafer notch 302 and wafer center 304 of the wafer 300. By locating the wafer notch 302, the pre-aligner step 102 ensures that the wafer 300 is correctly orientated and that the die axes are roughly aligned with the axes of the wafer-chuck translation stages when the wafer 300 is initially loaded onto the chuck.

The pre-aligner step 102 is followed by a low-magnification alignment step 104 and a high-magnification alignment step 106, both of which are performed after the wafer 300 has been loaded onto the chuck. The low-magnification alignment step 104 includes coarse theta correction. Typically, the low magnification alignment step 104 will physically rotate the wafer 300. The high-magnification alignment step 106 includes fine theta correction, which is more precise than the coarse theta correction of step 104. The low and high magnification steps 104 and 106 of wafer alignment locate two or more user-selected alignment targets that repeat across the wafer. The high-magnification alignment step 106 may also include calculation of a thermal scaling factor in the x-direction (i.e., along a row of die 308 on the wafer 300). For example, the locations of respective target structures in two die in a row are identified and the distance between the target structures is measured. The measured distance is compared to the expected distance between the target structures, which is known because it is based on the die pitch (e.g., as specified in the layout) in the x-direction. The ratio between the measured and expected distances provides the x-direction thermal scaling factor. The low-magnification and high-magnification wafer alignment steps 104 and 106 occur during a setup phase of the inspection process, prior to wafer inspection.

During the setup phase of the inspection process, the high-magnification alignment step 106 is followed by an XY premap step 108, in which specified premap swaths on the wafer 300 are executed (i.e., performed), such that images of corresponding regions on the wafer 300 are generated. A "swath" is a narrow rectangular region of the wafer 300 of arbitrary length. "Swath" is used to refer to the region itself, the image of the region, or the act of acquiring the image of the region, depending on the context. (In the context of the phrase "execute the swaths," the term "swath" refers to the act of acquiring the image of the region.) The height of the region may correspond to (e.g., approximately equal) the pixel height of the time-domain-integration (TDI) camera used to execute the swaths. For example, a first swath 306-1 on the top half of the wafer and a second swath 306-2 on the bottom half of the wafer are executed. A swath across the middle of the wafer may also be executed. Based on the image data of the premap swaths, the x-direction thermal scaling factor is refined and a y-direction thermal scaling factor is calculated. For example, the locations of respective target structures in die in the first swath 306-1 and second swath 306-2 are identified and the distance between the target structures in the y-direction (i.e., along a column of die 308 on the wafer 300) is measured. The measured distance is compared to the expected distance between the target structures in the y-direction, which is known because it is based on the die pitch (e.g., as specified in the layout) in the y-direction. The ratio between the measured and expected distances provides the y-direction thermal scaling factor. The x-direction and y-direction thermal scaling factors may be used during subsequent inspection of the wafer to determine the location of defects detected on the wafer. Similar to wafer-alignment targets, the premap targets (i.e., the target structures used in premap steps) may be selected by the user. Premap swath images are used solely for alignment; they are not used for defect detection.

Once the XY premap step 108 is complete, wafer inspection may begin. However, alignment (e.g., as indicated by theta correction and/or the x- and y-direction thermal scaling factors) may drift over time, for example as localized heating of the wafer 300 changes. Wafer inspection thus may be interrupted periodically to perform an absolute premap step 110 that restores or improves the global wafer alignment. Iterations of the absolute premap step 110 may be performed in accordance with a timer with a specified duration (e.g., 10 minutes): once the timer times out, another iteration of the absolute premap step 110 is performed. The timer is then reset and begins to count down again after that iteration of the absolute premap step 110 is complete and wafer inspection resumes.

A run-time alignment step 112 is performed while the wafer is being inspected, during execution of swaths. The run-time alignment step 112 refines alignment information determined during the XY premap step 108 and/or absolute premap step 110. The mis-alignment between equivalent image blocks in successive die are measured in real time as swathing proceeds. The results may be used to perform fine theta correction, to ensure that the wafer is being scanned horizontally. The results may also or alternatively be used to adjust the clocking of a TDI camera used for image acquisition, to keep the TDI camera synchronized with horizontal translation of the wafer. Because the run-time alignment step 112 is performed during wafer inspection (i.e., during the run-time acquisition of the swath images used for defect detection), the time available to determine alignment information during the run-time alignment step 112 is limited. The alignment information from the XY premap step 108 and/or absolute premap step 110 may be used to specify a starting point (e.g., a search window) used in the run-time alignment step 112 to calculate alignment information, allowing the run-time alignment step 112 to be performed within the limited time available.

Once an inspection swath has been executed (i.e., a corresponding region has been imaged using the TDI camera), a pixel-to-design alignment step 114 is performed, in which locations of target structures in images of respective die as collected during run-time (i.e., during execution of swaths) are compared to a known point. In one example, the known point is a location of the target structure in the layout of the die, as provided in a file that specifies the layout (e.g., in a gds file or similar file). Offsets are calculated as a result of this comparison and provided, along with respective images of respective inspected die, to a defect-detection algorithm that identifies the locations of defects on the wafer 300. While offsets calculated in the pixel-to-design alignment step 114 are used for defect detection, however, they are not used in subsequent iterations of alignment steps (e.g., steps 108, 110, and 112). Pixel-to-design alignment in step 114 occurs on the same swath images that are used for defect detection.

While the method 100 aligns the wafer image, the degree of alignment provided by the method 100 may not be sufficient for accurately determining the location of defects on the wafer, particularly as die geometries shrink.

SUMMARY

Accordingly, there is a need for improved methods and systems for target-reference wafer image alignment.

In some embodiments, a method of semiconductor-wafer image alignment is performed at a semiconductor-wafer defect-inspection system. In the method, a semiconductor wafer is loaded into the semiconductor-wafer defect-inspection system. Pre-inspection alignment is performed for the semiconductor wafer. After performing the pre-inspection alignment, a first swath is executed to generate a first image of a first region on the semiconductor wafer. An offset of a target structure in the first image with respect to a known point is determined. Defect identification is performed for the first image of the first swath, using the offset. After executing the first swath and determining the offset, a second swath is executed to generate a second image of a second region on the semiconductor wafer. While executing the second swath, run-time alignment of the semiconductor wafer is performed using the offset.

In some embodiments, a semiconductor-wafer defect-inspection system includes a semiconductor-wafer inspection tool, and further includes one or more processors and memory storing one or more programs for execution by the one or more processors. The one or more programs include instructions for performing the above method. In some embodiments, a non-transitory computer-readable storage medium stores one or more programs for execution by one or more processors of a semiconductor-wafer defect-inspection system. The one or more programs include instructions for performing the above method.

The method, semiconductor-wafer defect-inspection system, and computer-readable storage medium allow defect detection to be performed with high-accuracy determination of defect locations.

BRIEF DESCRIPTION OF THE DRAWINGS

For a better understanding of the various described embodiments, reference should be made to the Detailed Description below, in conjunction with the following drawings.

Like reference numerals refer to corresponding parts throughout the drawings and specification.

DETAILED DESCRIPTION

Reference will now be made in detail to various embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 2:
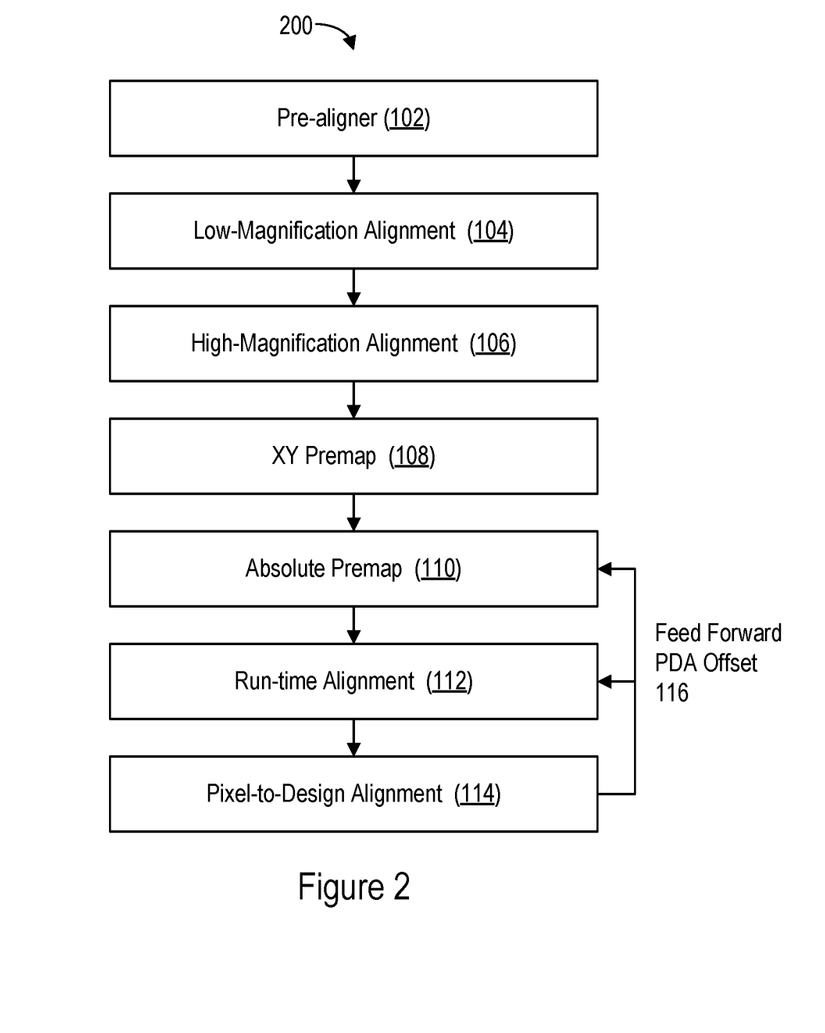
FIG. 2 is a flowchart showing a method of aligning a semiconductor wafer in a semiconductor-wafer defect-inspection system in accordance with some embodiments.

FIG. 2 is a flowchart showing a method 200 of aligning a semiconductor wafer (e.g., wafer 300, FIG. 3) in a semiconductor-wafer defect-inspection system (e.g., the system 500, FIG. 5) in accordance with some embodiments. The method 200 includes steps 102-114 of the method 100 (FIG. 1). The offset 116 calculated in a particular iteration of the pixel-to-design alignment step 114, however, is fed forward to a subsequent iteration of the absolute premap step 110, which uses the offset 116 to perform wafer image alignment. Alternatively, or in addition, the offset is fed forward to a subsequent iteration of the run-time alignment step 112, which uses the offset 116 to perform wafer image alignment. The offset 116 may be used as a starting point (e.g., may define a search window) for determining alignment information in the subsequent iteration of the absolute premap step 110 and/or run-time alignment step 112. The offset 116 is also provided to and used by a defect-detection algorithm that identifies the locations of defects on the wafer 300, as in the method 100.

Figure 4:
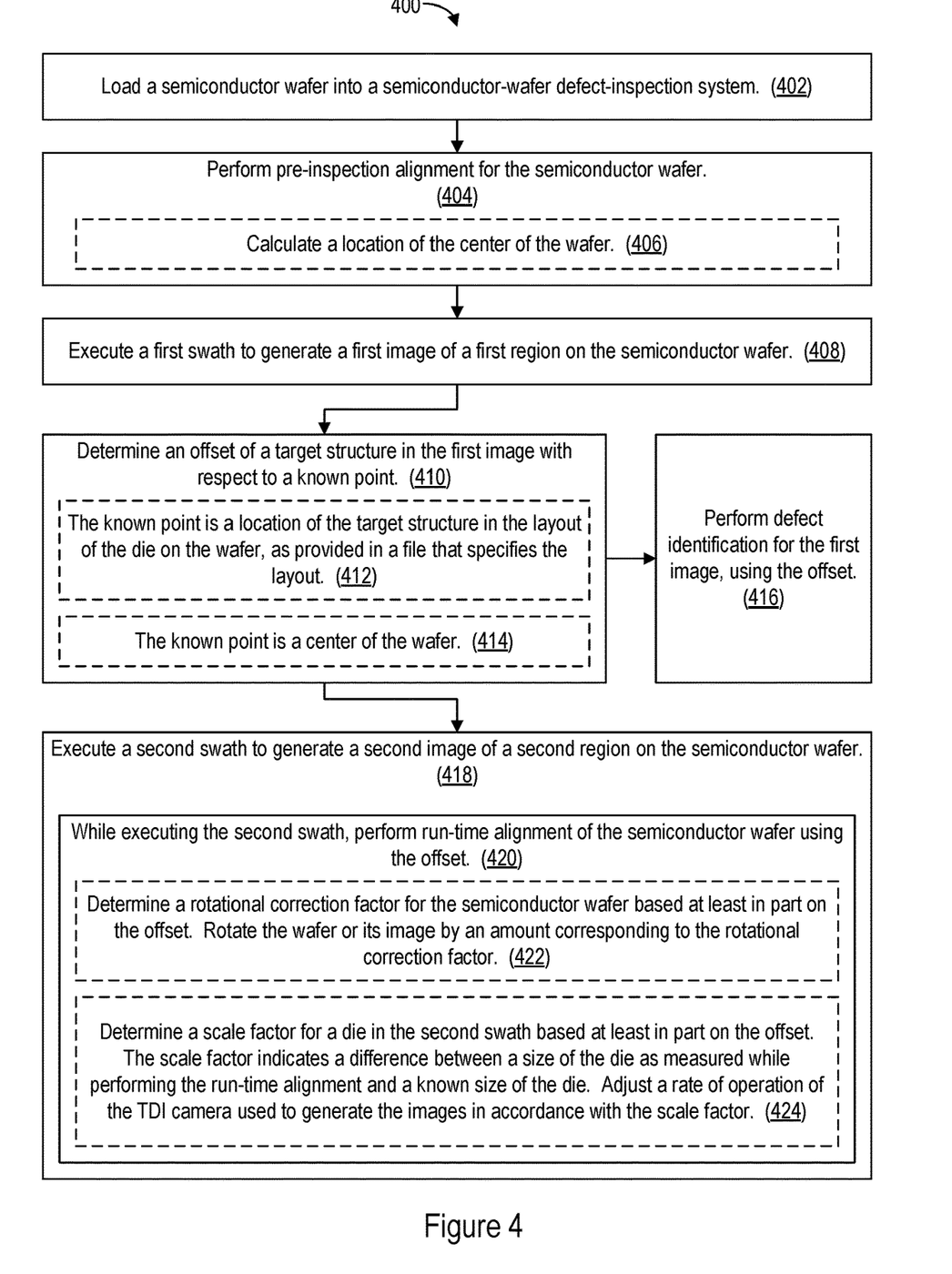
FIG. 4 is a flowchart showing a method of aligning a semiconductor wafer in a semiconductor-wafer defect-inspection system in accordance with some embodiments.

The use of an offset such as the offset 116 for wafer image alignment is further described with respect to a method 400 of aligning a semiconductor wafer target and reference image in accordance with some embodiments. FIG. 4 is a flowchart showing the method 400, which is performed in a semiconductor-wafer defect-inspection system (e.g., the system 500, FIG. 5). In the method 400, a semiconductor wafer (e.g., wafer 300, FIG. 3) is loaded (402) into the semiconductor-wafer defect-inspection system. The semiconductor wafer may include a plurality of die (e.g., die 308, FIG. 3) with the same design and layout (i.e., die that share a common design and layout). Pre-inspection alignment (e.g., pre-alignment step 102, FIG. 2, before the wafer is loaded onto the wafer chuck 507, FIG. 5; low-magnification alignment step 104 and/or high-magnification alignment step 106, FIG. 2, after the wafer has been loaded onto the wafer chuck 507) is then performed (404) for the semiconductor wafer. In some embodiments, the pre-inspection alignment includes calculating (406) a location of the center of the wafer.

Inspection of the semiconductor wafer commences. A first swath is executed (408) to generate a first image of a first region (i.e., to generate a first swath image) on the semiconductor wafer. The first swath is an inspection swath executed during wafer-inspection run-time and is thus distinct from premap swaths. To allow proper analysis of the first image, an offset (e.g., PDA offset 116, FIG. 2) of a target structure in the first image with respect to a known point is determined (410) (e.g., in pixel-to-design alignment step 114, FIG. 2). In some embodiments, the known point is (412) a location of the target structure in the common layout of the die on the wafer, as provided in a file that specifies the layout (e.g., in a gds file or similar file). The target structure may be one of many target structures on the die and may have been selected for use based on having a desired degree of robustness for target identification (e.g., a degree of robustness for target identification that satisfies a threshold). In some other embodiments, the known point is (414) a center of the wafer (e.g., wafer center 304, FIG. 3, as calculated in step 406).

Defect identification for the first image is performed (416), using the offset.

A second swath is executed (418) to generate a second image of a second region (i.e., to generate a second swath image) on the semiconductor wafer. The second swath, like the first swath, is an inspection swath executed during run-time and thus distinct from premap swaths. Executing the second swath may include generating and buffering an image of a first die in the second region and an image of a second die (e.g., adjacent to the first die) in the second region (and images of additional die in the second region as well, in accordance with some embodiments). The first and second die may be considered to be in the second region even if the second region is narrower (e.g., has a lower height) than the first and second die (e.g., such that executing the second swath captures a stripe across the first and second die). While the second swath is being executed, run-time alignment of the semiconductor wafer is performed (420) using the offset (e.g., in run-time alignment step 112, FIG. 2).

In some embodiments, performing (420) run-time alignment includes determining (422) a rotational correction factor for the semiconductor wafer based at least in part on the offset. The wafer or its image is rotated by an amount corresponding to (e.g., equal to) the rotational correction factor. For example, to determine (422) the rotational correction factor, a difference between a location of the target structure in the image of the first die in the second region and a location of the target structure in the image of the second die in the second region is identified. A search window for the rotational correction factor is specified based at least in part on the offset, and a search for the rotational correction factor is performed within the search window, in accordance with the identified difference (i.e., a rotational correction factor within the search window that accounts for the identified difference is found).

In some embodiments, performing (420) run-time alignment additionally or alternatively includes determining (424) a scale factor (e.g., a thermal scaling factor) for a die in the second region based at least in part on the offset. The scale factor indicates a difference between a size of the die as measured while performing the run-time alignment and a known size of the die. A rate of operation of a TDI camera (e.g., TDI camera 508, FIG. 5) used to generate the images is adjusted in accordance with the scale factor. For example, to determine the scale factor, a difference between a location of the target structure in the image of the first die in the second region and a location of the target structure in the image of the second die in the second region is identified. A search window for the scale factor is specified based at least in part on the offset, and a search for the scale factor is performed within the search window, in accordance with the identified difference (i.e., a scale factor within the search window that accounts for the identified difference is found).

Step 416 may be performed before or after step 418, or performance of steps 416 and 418 may overlap.

Steps 408, 410 (e.g., including step 412 or 414), 416, 418, and 420 (e.g., including steps 422 and/or 424) may be repeated for successive swaths that are executed as part of inspecting the wafer. For example, the offset determined in step 410 may be considered a first offset. A second offset of the target structure in the second image (as generated in step 418) is determined with respect to the known point. Defect identification for the second image is performed (e.g., as a second iteration of step 416), using the second offset. A third swath is then executed to generate a third image of a third region on the semiconductor wafer (e.g., as a second iteration of step 418). While the third swath is being executed, run-time alignment of the semiconductor wafer is performed using the second offset (e.g., as a second iteration of step 420).

The method 400 may include additional steps. In some embodiments, after performing (404) the initial pre-inspection alignment and before generating (408) the first image, a second pre-inspection alignment (e.g., XY premap step 108, FIG. 2) is performed for the semiconductor wafer. Performing the second pre-inspection alignment includes executing a specified plurality of swaths (e.g., premap swaths) on the semiconductor wafer, including a swath on a top half of the wafer and a swath on a bottom half of the wafer (e.g., swaths 306-1 and 306-2, FIG. 3), to inspect a specified plurality of respective regions on the semiconductor wafer, and further includes aligning the semiconductor wafer based on the execution of the specified plurality of swaths (i.e., on the inspection of the specified plurality of respective regions). The specified plurality of swaths may be different from the first and/or second swaths of steps 408 and 418. In some embodiments, the second pre-inspection alignment for the semiconductor wafer is periodically repeated (e.g., based on a timer) during inspection of the semiconductor wafer: inspection is halted while the specified plurality of swaths is re-executed and the wafer and/or wafer image aligned accordingly (e.g., absolute premap step 110 is performed). A respective instance of the second pre-inspection alignment performed during inspection of the semiconductor wafer may be performed based at least in part on the offset determined in step 410. For example, a particular instance of the second pre-inspection alignment may use the offset determined in step 410 as a starting point (e.g., the offset specifies a search window used in the particular instance of the second pre-inspection alignment).

Figure 5:
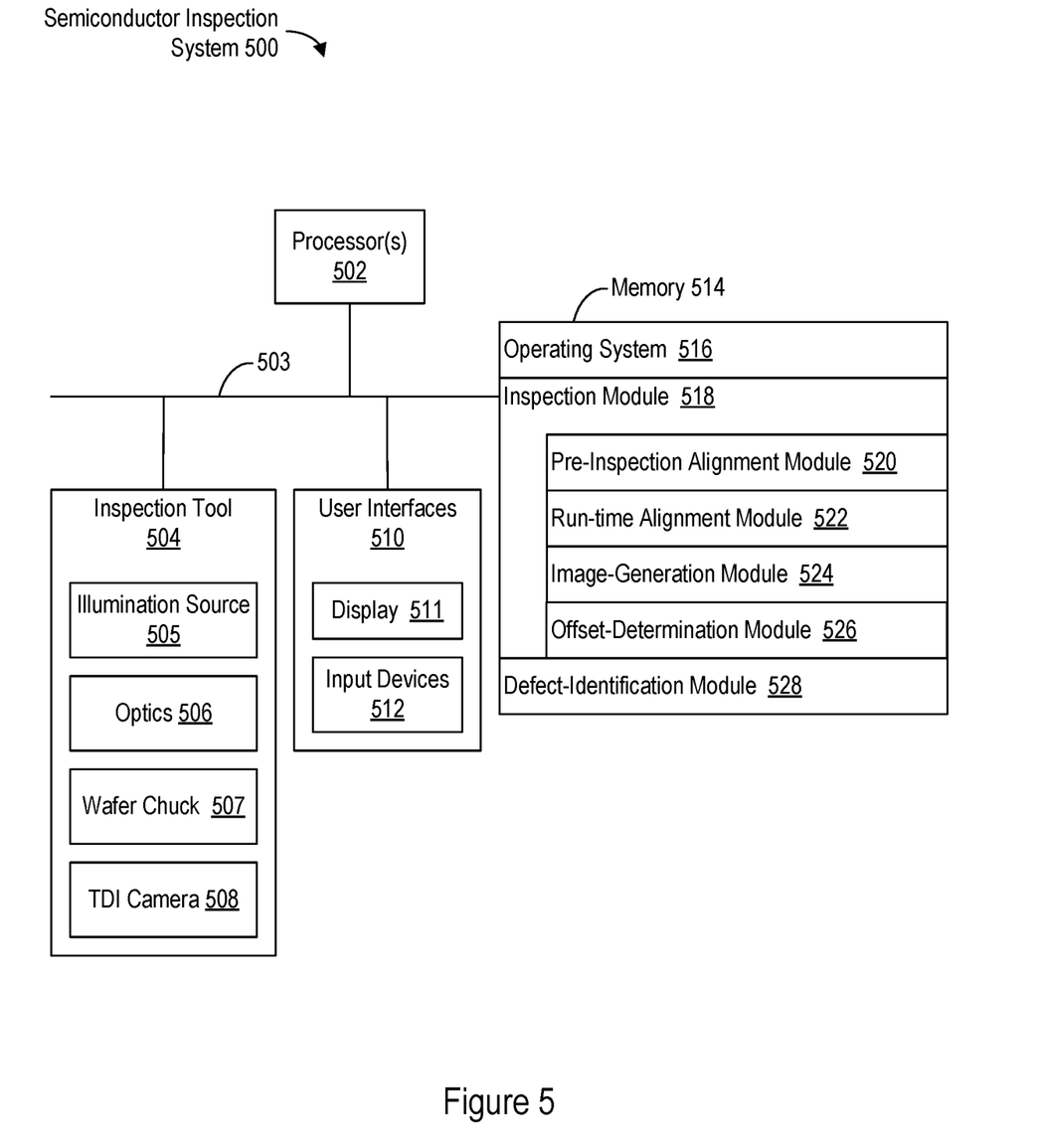
FIG. 5 is a block diagram of a semiconductor-wafer defect-inspection system in accordance with some embodiments.

FIG. 5 is a block diagram of a semiconductor-wafer defect-inspection system 500 in accordance with some embodiments. The system 500 includes a semiconductor-wafer inspection tool 504 and an associated computer system that includes one or more processors 502 (e.g., CPUs), user interfaces 510, memory 514, and one or more communication buses 503 interconnecting these components. The system 500 may also include one or more network interfaces (wired and/or wireless, not shown) for communicating with (e.g., retrieving recipes from and/or transmitting data to) remote computer systems.

The inspection tool 504 includes an illumination source 505, illumination and collection optics 506, a wafer chuck 507, and a TDI camera 508. Semiconductor wafers (e.g., the wafer 300, FIG. 3) are loaded onto the wafer chuck 507 for inspection. The illumination source 505 generates an optical beam, which is provided to a semiconductor wafer on the wafer chuck 507 by the illumination optics of the optics 506. The collection optics of the optics 506 collect the optical beam as scattered off of the wafer surface and provide the scattered optical beam to the TDI camera 508, which images the scattered optical beam.

The user interfaces 510 may include a display 511 and one or more input devices 512 (e.g., a keyboard, mouse, touch-sensitive surface of the display 511, etc.). The display 511 may display results of defect identification.

Memory 514 includes volatile and/or non-volatile memory. Memory 514 (e.g., the non-volatile memory within memory 514) includes a non-transitory computer-readable storage medium. Memory 514 optionally includes one or more storage devices remotely located from the processors 502 and/or a non-transitory computer-readable storage medium that is removably inserted into the computer system. In some embodiments, memory 514 (e.g., the non-transitory computer-readable storage medium of memory 514) stores the following modules and data, or a subset or superset thereof: an operating system 516 that includes procedures for handling various basic system services and for performing hardware-dependent tasks, an inspection module 518, and/or a defect-identification module 524 (e.g., for performing step 416, FIG. 4). The inspection module 518 may include a pre-inspection alignment module 520 (e.g., for performing steps 102-110, FIG. 2; step 404, FIG. 4), a run-time alignment module 522 (e.g., for performing step 112, FIG. 2; step 420, FIG. 4), an image-generation module (i.e., a swath-execution module) 524 (e.g., for performing steps 408 and 418, FIG. 4), and/or an offset determination module 528 (e.g., for performing 114, FIG. 2; step 410, FIG. 4).

The memory 514 (e.g., the non-transitory computer-readable storage medium of the memory 514) thus includes instructions for performing all or a portion of the methods 200 and/or 400 (FIGS. 2, 4). Each of the modules stored in the memory 514 corresponds to a set of instructions for performing one or more functions described herein. Separate modules need not be implemented as separate software programs. The modules and various subsets of the modules may be combined or otherwise re-arranged. In some embodiments, the memory 514 stores a subset or superset of the modules and/or data structures identified above.

FIG. 5 is intended more as a functional description of the various features that may be present in a semiconductor-wafer defect-inspection system than as a structural schematic. For example, the arrangement of the components of the inspection tool 504 may vary (e.g., in manners known in the art). Items shown separately could be combined and some items could be separated. Furthermore, the functionality of the system 500 may be split between multiple devices. For example, a portion of the modules stored in the memory 514 may alternatively be stored in one or more computer systems communicatively coupled with the system 500 through one or more networks.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A semiconductor-wafer defect-inspection system, comprising:
   a semiconductor-wafer inspection tool;
   one or more processors; and
   memory storing one or more programs for execution by the one or more processors, the one or more programs comprising instructions for:
   performing pre-inspection alignment for a semiconductor wafer;
   after performing the pre-inspection alignment, executing a first swath to generate a first image of a first region on the semiconductor wafer;
   determining an offset of a target structure in the first image with respect to a known point;
   performing defect identification for the first image, using the offset;
   after executing the first swath and determining the offset, executing a second swath to generate a second image of a second region on the semiconductor wafer; and
   while executing the second swath, performing run-time alignment of the semiconductor wafer using the offset.

2. The system of claim 1, wherein:
   the semiconductor wafer comprises a plurality of die having a common layout; and
   the known point is a location of the target structure in the common layout, wherein the location of the target structure in the common layout is provided in a file that specifies the layout.

3. The system of claim 1, wherein the known point is a center of the wafer.

4. The system of claim 3, wherein the instructions for performing the pre-inspection alignment comprise instructions for calculating a location of the center of the wafer.

5. The system of claim 1, wherein the instructions for performing run-time alignment of the semiconductor wafer using the offset comprise instructions for:
   determining a rotational correction factor for the semiconductor wafer based at least in part on the offset; and
   rotating the wafer or an image of the wafer by an amount corresponding to the rotational correction factor.

6. The system of claim 5, wherein:
   the instructions for executing the second swath comprise instructions for generating and buffering an image of a first die in the second region and an image of a second die in the second region; and the instructions for determining the rotational correction factor for the semiconductor wafer comprise instructions for:
identifying a difference between a location of the target structure in the image of the first die in the second region and a location of the target structure in the image of the second die in the second region;
specifying a search window for the rotational correction factor based at least in part on the offset; and
searching within the search window for the rotational correction factor, in accordance with the identified difference.

7. The system of claim 6, wherein the first die is adjacent to the second die in the second swath.

8. The system of claim 1, wherein:
the semiconductor-wafer defect-inspection system comprises a time-domain-integration (TDI) camera;
the instructions for executing the first swath and the second swath comprise instructions for using the TDI camera to generate the first image and the second image; and
the instructions for performing run-time alignment of the semiconductor wafer using the offset comprise instructions for:
determining a scale factor for a die in the second region based at least in part on the offset, wherein the scale factor indicates a difference between a size of the die as measured while performing the run-time alignment and a known size of the die; and
adjusting a rate of operation of the TDI camera in accordance with the scale factor.

9. The system of claim 8, wherein:
the instructions for executing the second swath comprise instructions for generating and buffering an image of a first die in the second region and an image of a second die in the second region; and
the instructions for determining the scale factor comprise instructions for:
identifying a difference between a location of the target structure in the image of the first die in the second region and a location of the target structure in the image of the second die in the second region;
specifying a search window for the scale factor based at least in part on the offset; and
searching within the search window for the scale factor, in accordance with the identified difference.

10. The system of claim 9, wherein the first die is adjacent to the second die in the second region.

11. The system of claim 1, wherein the one or more programs further comprise instructions for performing a second pre-inspection alignment for the semiconductor wafer after performing the initial pre-inspection alignment and before generating the first image, the instructions for performing the second pre-inspection alignment comprising instructions for:
executing a specified plurality of swaths to inspect a specified plurality of respective regions on the semiconductor wafer, the specified plurality of swaths comprising a first swath to be executed on a top half of the wafer and a second swath to be executed on a bottom half of the wafer; and
aligning the semiconductor wafer based on the execution of the specified plurality of swaths.

12. The system of claim 11, the one or more programs further comprising instructions for periodically repeating the second pre-inspection alignment for the semiconductor wafer during inspection of the semiconductor wafer, wherein a respective instance of the second pre-inspection alignment to be performed during inspection of the semiconductor wafer is to be performed based at least in part on the offset.

13. The system of claim 11, wherein the second swath is distinct from the specified plurality of swaths.

14. The system of claim 1, wherein the offset is a first offset, the one or more programs further comprising instructions for:
determining a second offset of the target structure in the second image with respect to the known point;
performing defect identification for the second image, using the second offset;
after executing the second swath and determining the second offset, executing a third swath to generate a third image of a third region on the semiconductor wafer; and
while executing the third swath, performing run-time alignment of the semiconductor wafer using the second offset.

15. A method of semiconductor-wafer image alignment, comprising, at a semiconductor-wafer defect-inspection system:
loading a semiconductor wafer into the semiconductor-wafer defect-inspection system;
performing pre-inspection alignment for the semiconductor wafer;
after performing the pre-inspection alignment, executing a first swath to generate a first image of a first region on the semiconductor wafer;
determining an offset of a target structure in the first image with respect to a known point;
performing defect identification for the first image, using the offset;
after executing the first swath and determining the offset, executing a second swath to generate a second image of a second region on the semiconductor wafer; and
while executing a second swath, performing run-time alignment of the semiconductor wafer using the offset.

16. A non-transitory computer-readable storage medium storing one or more programs for execution by one or more processors of a semiconductor-wafer defect-inspection system, the one or more programs comprising instructions for:
performing pre-inspection alignment for a semiconductor wafer;
after performing the pre-inspection alignment, executing a first swath to generate a first image of a first region on the semiconductor wafer;
determining an offset of a target structure in the first image with respect to a known point;
performing defect identification for the first image, using the offset;
after executing the first swath and determining the offset, executing a second swath to generate a second image of a second region on the semiconductor wafer; and
while executing the second swath, performing run-time alignment of the semiconductor wafer using the offset.

* * * * *